US012674822B2

(12) United States Patent

Houis

(10) Patent No.: US 12,674,822 B2

(45) Date of Patent: Jul. 7, 2026

(54) MAGNETIC SENSOR STRUCTURE, DEVICE AND SYSTEM

(71) Applicant: Melexis Technologies SA, Bevaix (CH)

(72) Inventor: Simon Houis, Bevaix (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 147 days.

(21) Appl. No.: 18/673,965

(22) Filed: May 24, 2024

(65) Prior Publication Data

US 2025/0004018 A1 Jan. 2, 2025

(30) Foreign Application Priority Data

Jun. 28, 2023 (EP) ..................................... 23182193

(51) Int. Cl.
| | |
|---|---|
| *G01R 15/20* | (2006.01) |
| *G01D 5/14* | (2006.01) |
| *G01R 19/00* | (2006.01) |

(52) U.S. Cl.
CPC ........... *G01R 15/202* (2013.01); *G01D 5/145* (2013.01); *G01R 19/0092* (2013.01)

(58) Field of Classification Search
None
See application file for complete search history.

(56) References Cited

U.S. PATENT DOCUMENTS

| | | | |
|---|---|---|---|
| 2013/0207650 A1 | 8/2013 | Koop | |
| 2018/0113176 A1 | 4/2018 | Nagata et al. | |
| 2021/0025948 A1* | 1/2021 | Bito | G01R 33/0011 |
| 2021/0055131 A1* | 2/2021 | Dupre | G01D 5/145 |
| 2022/0137161 A1* | 5/2022 | Bidaux | G01R 33/07 |
| | | | 324/251 |
| 2025/0341549 A1* | 11/2025 | Gallot | G01R 33/07 |

FOREIGN PATENT DOCUMENTS

| | | |
|---|---|---|
| EP | 3650816 A1 | 5/2020 |
| WO | 2021050406 A1 | 3/2021 |

OTHER PUBLICATIONS

European Search Report from corresponding EP Application No. 23182193.5, Dec. 7, 2023.

* cited by examiner

*Primary Examiner* — Jermele M Hollington

(74) *Attorney, Agent, or Firm* — WORKMAN NYDDEGER

(57) ABSTRACT

A sensor device includes at least one integrated magnetic sensor structure having: a semiconductor substrate; a magnetic flux concentrator IMC disposed on top of the semiconductor substrate, the IMC having a predefined shape with an elongated portion extending in a first direction parallel to the substrate; a horizontal Hall element situated under a centre of the IMC; a processing circuit connected to said horizontal Hall element, and configured to provide a signal or a value indicative of at least one magnetic field gradient or a signal or value derived therefrom.

13 Claims, 10 Drawing Sheets preferably (L / W) ≥ 3, or ≥ 4, or ≥ 6, or ≥ 8, or ≥ 10
preferably (L / W) ≤ 20
preferably (W / s) ≥ 1.0, or ≥ 1.5, or ≥ 2.0, or ≥ 2.5
preferably d12 ≥ L*41%

FIG. 2B          FIG. 2E

Bx_cm + diff_Bx          Bz_cm + diff_Bz

$$\left\{\begin{array}{ll} h1=Gx^*(Bx+dBx/dx)+Gz^*(Bz+dBz/dx) & [1] \\ h2=2^*Gx^*(dBx/dx)+Gz^*(Bz) & [2] \\ h3=Gx^*(-Bx+dBx/dx)+Gz^*(Bz-dBz/dx) & [3] \end{array}\right.$$

$$s1=(h1+h3)=2^*Gx^*(dBx/dx)+2^*Gz^*(Bz) \qquad [4a]$$
$$\approx 2^*Gz^*(Bz) \qquad [4b]$$

$$s2=2^*h2-(h1+h3)=2^*Gx^*(dBx/dx) \qquad [5]$$
$$\text{even if } Bx\neq0; \ Bz\neq0; \ (dBz/dx)\neq0$$

$$s3=(h1-h3)=2^*Gx^*(Bx)+2^*Gz^*(dBz/dx) \qquad [6a]$$
$$\approx 2^*Gx^*(Bx) \qquad [6b]$$

FIG. 3

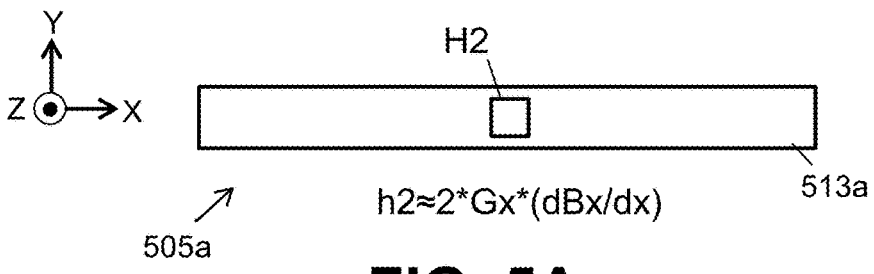
$$h2 \approx 2*Gx*(dBx/dx)$$
FIG. 5A
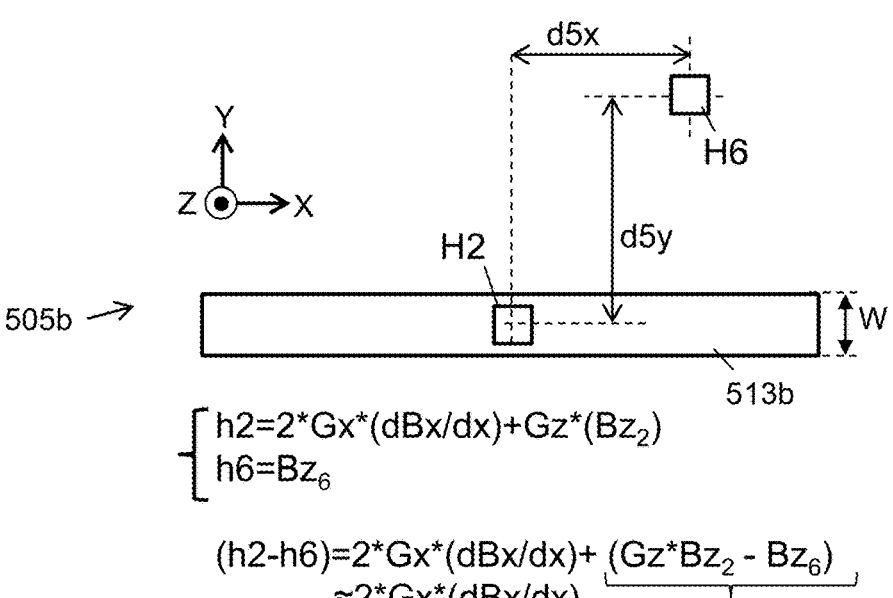
$$\begin{cases} h2 = 2*Gx*(dBx/dx) + Gz*(Bz_2) \\ h6 = Bz_6 \end{cases}$$
$$(h2-h6) = 2*Gx*(dBx/dx) + \underbrace{(Gz*Bz_2 - Bz_6)}_{\approx 0}$$
$$\approx 2*Gx*(dBx/dx)$$
FIG. 5B
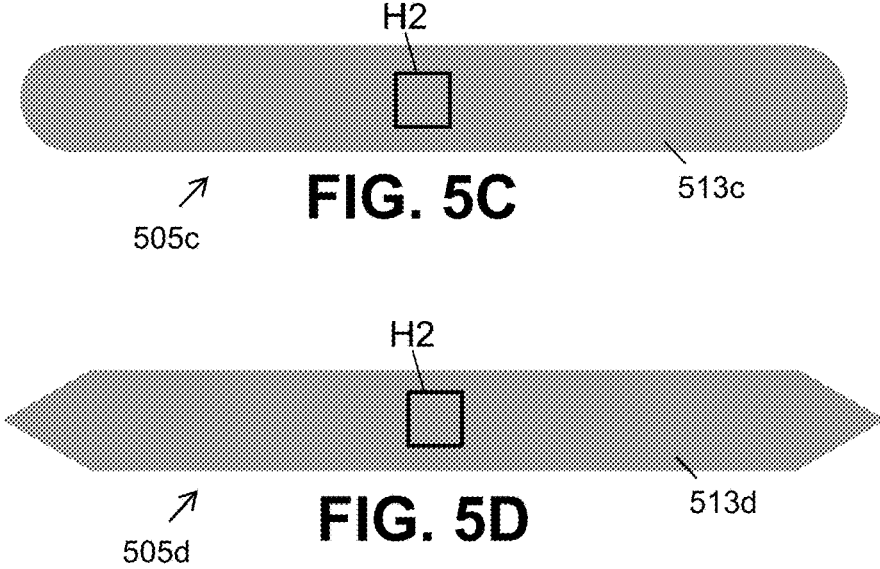
FIG. 5C
FIG. 5D e.g. d6= (26% to 40%) of L
e.g. d6=(L/3) ±7% s6=(h2-h4) ≈ 2*Gx*(dBx/dx)

preferably d7a=d7b=d7
e.g. d7= (26% to 40%) of L
e.g. d7≈(L/3) ±7% s7 = 2*h2-(h4+h5) ≈ 4*Gx*(dBx/dx)

only or mainly dependent on gradients,
substantially independent of an external disturbance field
$s8 = (h1 + h3 - h2)$;     $I8 = K8*(h1 + h3 - h2)$
$s8' = (h1 + h3 - 2*h2)$;   $I8' = K8'*(h1 + h3 - 2*h2)$ $$s9 = (h2a - h2b)$$
$$I = K9*(h2a - h2b)$$

s10=(h2a-h2b)
I=K10*(h2a-h2b)

MAGNETIC SENSOR STRUCTURE, DEVICE AND SYSTEM

FIELD OF THE INVENTION

The present invention relates in general to the field of magnetic sensor devices and systems, and more in particular to magnetic sensor structures or devices for measuring a magnetic field gradient.

BACKGROUND OF THE INVENTION

Magnetic sensor devices comprising a semiconductor substrate and at least one horizontal Hall element, are known in the art. They are used for example in linear position sensor devices, angular position sensor devices, current sensor devices, presence detectors, proximity detectors, etc.

It is well known that a horizontal Hall element can be used to measure a magnetic field component (e.g. Bz) oriented perpendicular to a semiconductor substrate, whereas vertical Hall elements and magneto-resistive (MR) elements (e.g. GMR, XMR, AMR) can measure a magnetic field component (e.g. Bx, By) parallel to the semiconductor substrate.

It is known that a magnetic sensor structure comprising an integrated magnetic flux concentrator (IMC) having a circular shape, and comprising two horizontal Hall elements located near a periphery of this IMC, 180° spaced apart, can be used to measure an in-plane component (e.g. Bx component parallel to a substrate) and an out-of-plane component (e.g. Bz component perpendicular to the substrate) of a magnetic field, for example as illustrated in FIG. 6A of EP3650816 (A1).

A current sensor system typically comprises a magnetic sensor device and an electrical conductor, e.g. an integrated conductor or an external conductor, e.g. a bus bar. By measuring the magnetic field generated by the current flowing through the conductor, the current can be determined in a non-contact manner.

Many variants of magnetic sensor structures and devices and systems exist, addressing one or more of the following requirements: using a simple or cheap magnetic structure, using a simple or cheap sensor device, being able to measure over a relatively large measurement range, being able to measure with great accuracy, requiring only simple arithmetic, being able to measure at high speed, being highly robust against positioning errors, being highly robust against an external disturbance field, providing redundancy, being able to detect an error, being able to detect and correct an error, having a good signal-to-noise ratio (SNR), etc. Often two or more of these requirements conflict with each other, hence a trade-off needs to be made.

There is always room for improvements or alternatives.

SUMMARY OF THE INVENTION

It is an object of embodiments of the present invention to provide a magnetic sensor structure or a magnetic sensor arrangement that can be used to measure a magnetic field gradient.

It is also an object of embodiments of the present invention to provide a magnetic sensor device (e.g. a semiconductor wafer, a semiconductor die, a packaged device comprising at least one semiconductor die, also referred to as "chip") comprising such a magnetic sensor structure.

It is also an object of embodiments of the present invention to provide a magnetic sensor system, e.g. a current sensor system comprising such a magnetic sensor device (e.g. in the form of an integrated chip) and an electrical conductor; or a position sensor system comprising such a magnetic sensor device and a permanent magnet which is movable relative to the sensor device; or a torque sensor system comprising such a magnetic sensor device and at least one magnet; etc.

It is an object of embodiments of the present invention to provide such a magnetic sensor structure, device and system, that can measure the magnetic field gradient with improved accuracy, e.g. which is highly insensitive to an external disturbance field.

It is an object of particular embodiments of the present invention to provide such a magnetic sensor structure, device and system, that can measure a magnetic field gradient using a simple structure, e.g. an IMC and one or two or three or more horizontal Hall elements.

It is an object of embodiments of the present invention to provide such a magnetic sensor structure, a device and a system, that is suitable for use in a robotic and/or industrial and/or automotive environment.

These and other objectives are accomplished by embodiments of the present invention.

According to a first aspect, the present invention provides a sensor device (e.g. an integrated semiconductor device, also known as "chip") comprising: at least one (e.g. only one, or two) integrated magnetic sensor structure comprising: a semiconductor substrate (e.g. a silicon substrate); a magnetic flux concentrator (IMC) disposed on top of the semiconductor substrate, the magnetic flux concentrator (IMC) having a predefined shape with an elongated portion extending in a first direction (X) parallel to the semiconductor substrate; a horizontal Hall element (e.g. H2) provided in or on the substrate, and situated under a centre of the IMC; a processing circuit connected to said horizontal Hall element (e.g. H2), and configured to provide a signal or value indicative of at least one magnetic field gradient (e.g. dBx/dx) of a magnetic field ambient to the at least one integrated magnetic sensor structure, or a signal or a value derived therefrom (e.g. a current value, a linear or angular position value, a distance value).

The magnetic field gradient so measured is a gradient (denoted as dBx/dx) of a magnetic field component Bx oriented in the first direction, along the first direction.

With "situated under a centre" is meant that an imaginary line oriented perpendicular to the substrate, and passing through the geometric centre of the predefined shape passes through the horizontal Hall element.

The sensor device may comprise e.g. a single semiconductor substrate, comprising a single "integrated magnetic sensor structure", or may comprise two discrete semiconductor substrates, each comprising a single "integrated magnetic sensor structure", or may comprise a single semiconductor substrate comprising two "integrated magnetic sensor structures".

The integrated magnetic sensor structure may comprise more than one Horizontal Hall element, e.g. two horizontal Hall elements situated near the ends of the elongated IMC (e.g. H1 and H3 of FIG. 1B), or a horizontal Hall element which is not located under the IMC (e.g. H6 of FIG. 5B), or a horizontal Hall element which is also located under the IMC but spaced relatively far from the centre (e.g. H4 of FIG. 6), or two horizontal Hall elements located in so called "white zones" (e.g. H4 and H5 of FIG. 7).

The signal or value may be derived from the at least one measured signal using a linear function of the one or more measured signals.

The horizontal Hall element may be embedded in the semiconductor substrate, and may be located on the "top side" of the semiconductor substrate (also known as "device side"). The IMC associated with this horizontal Hall element is preferably also located on the top side of the semiconductor substrate. Preferably there is no IMC located on the back side of the semiconductor substrate.

If the semiconductor substrate comprises more than one IMC on its top side (e.g. as illustrated in FIG. 9A, FIG. 9B, FIG. 10), these IMC's are preferably spaced apart by at least 200 μm, or at least 250 μm, or at least 300 μm, or at least 400 μm, or at least 500 μm, or at least 600 μm, or at least 700 μm, or at least 800 μm, or at least 900 μm, or at least 1000 μm.

The predefined shape is not a circular shape or a ring shape.

The semiconductor substrate may be a silicon substrate.

Preferably the semiconductor substrate has an active surface, and the horizontal Hall element is implemented in said active surface, and the IMC is located on the active surface with at least one intermediate layer. The horizontal Hall element and the IMC are preferably located on the same side of the semiconductor substrate.

The IMC may have a constant thickness over its entire length.

The IMC may have a linear shape.

In an embodiment, the predefined shape is an overall beam shape having a predefined length L and a predefined width W. Preferably this beam shape is a single solid piece of material without a gap.

In an embodiment, the elongated portion has an overall rectangular cross section in a plane parallel to the substrate, the rectangular cross section having a predefined length L and a predefined width W.

The horizontal Hall element may have a substantially square plate having a length and a width of 15 to 25 μm, e.g. a length and a width of about 20 μm, or about 22 μm.

The width W of the IMC is preferably a value in the range from 10 μm to 200 μm. The width W of the IMC may be at least 20 μm, or at least 30 μm, or at least 40 μm, or at least 50 μm, or at least 75 μm, e.g. equal to about 100 μm±10%.

The length L of the IMC is preferably a value in the range from 250 μm to 1000 μm. The length L of the IMC may be at least 300 μm, or at least 400 μm, or at least 500 μm, or at least 600 μm, or at least 700 μm, or at least 800 μm, or at least 900 μm, e.g. equal to about 1000 μm±10%.

In an embodiment, a ratio (L/W) of the length L and the width W of the IMC is at least 3.0.

In an embodiment, a ratio (L/W) of the length L and the width W of the IMC is a value in the range from 3.0 to 20.0.

In an embodiment, a ratio (L/W) of the length L and the width W of the IMC is a value in the range from 4.0 to 10.0.

In an embodiment, a ratio (L/W) of the length L and the width W of the IMC is a value in the range from 5.0 to 10.0.

In an embodiment, a ratio (L/W) of the length L and the width W of the IMC is a value in the range from 6.0 to 10.0.

The magnetic flux concentrator (IMC) may have a thickness T in the range from 15 μm to 29 μm, or from 18 μm to 25 μm, e.g. equal to 20±1 μm, or equal to about 22±1 μm.

In an embodiment, the sensor device comprises only a single IMC and only one horizontal Hall element is situated under the IMC. Examples of such an embodiment is illustrated in FIG. 5A and FIG. 5B.

In an embodiment, the sensor device comprises two magnetic flux concentrators, and only one horizontal Hall element is situated under the IMC. The sensor device may comprise a single semiconductor substrate comprising both horizontal Hall elements, and comprising both IMC on top, or may comprise two separate semiconductor substrates, each having a single IMC, with at least one horizontal Hall element below the IMC. Examples of such an embodiment is illustrated in FIG. 9A, FIG. 9B, FIG. 10.

In an embodiment, the IMC has an elongated shaped extending over a predefined length L; and the integrated magnetic sensor structure further comprises a second horizontal Hall element (e.g. H4) situated under the IMC, and spaced from a centre of the IMC by a distance in the range from L*26% to L*40%; or in the range from L*30% to L*36%, or in the range of (L/3)±7%, or in the range of (L/3)±5%, or in the range of (L/3)±3%. It is an advantage of locating the second horizontal Hall element in the so called "white spot" because the signal obtained from this Hall element will be highly insensitive to a common mode value of Bx.

In an embodiment, the IMC has an elongated shaped extending over a predefined length L; and the integrated magnetic sensor structure further comprises a second horizontal Hall element and a third horizontal Hall element (e.g. H1 and H3, or H4 and H5) situated under the IMC, arranged such that the first horizontal Hall element is situated in the middle between the second and the third horizontal Hall element. Examples of this embodiment are illustrated in FIG. 1A to FIG. 3, FIG. 7, FIG. 8A, and FIG. 8B.

In an embodiment, the distance (e.d. d12) between the centre of the IMC and the second and third Horizontal Hall element (e.g. H1, H3) is at least L*41%.

Or stated in simple words, in this embodiment one Horizontal Hall element (e.g. H2) is located near the centre of the IMC, and two horizontal Hall elements (e.g. H1, H3) are located near the ends of the IMC. Example of this embodiment are illustrated in FIG. 1B, FIG. 2(a), FIG. 8A, FIG. 8B. It is a major advantage of this embodiment that it can accurately measure a gradient (dBx/dx) of Bx along the X-direction, using only three horizontal Hall elements and a single IMC.

In an embodiment, the distance is a value in the range from L*41% to L*60%.

In an embodiment, the distance is a value in the range from L*41% to (L/2)+(s/2), where "s" is the length or width of the (square) Hall element.

In an embodiment, the distance is a value in the range from L*41% to L*50%, i.e. that the IMC overlaps at least 50% of the Hall element.

In an embodiment, the distance is a value in the range from L*41% to (L/2)−(s/2), i.e. that the IMC fully overlaps the Hall element.

In an embodiment, the distance (e.g. d7a, d7b) between the centre of the IMC and the second and third Horizontal Hall element (e.g. H4, H5) is a distance in the range from L*26% to L*40%, or in the range from L*30% to L*36%, or in the range of (L/3)±7%, or in the range of (L/3)±5%, or in the range of (L/3)±3%. An example of this embodiment is illustrated in FIG. 7.

Or stated in simple words, in this embodiment one Horizontal Hall element is located near the centre of the IMC, and two horizontal Hall elements are located on opposite sides of the centre, at a distance d7a, d7b from the centre equal to about (L/3).

In an embodiment, the sensor device is a current sensor device configured for measuring a magnetic field characteristic (e.g. a magnetic field gradient) generated by a current flowing through an electrical conductor portion; wherein the processing circuit is configured to provide a signal or value indicative of said current, based on at least one signal obtained from the at least one horizontal Hall element, e.g. as a linear function of the signals obtained from the horizontal Hall elements.

The current sensor device may further comprise the above mentioned processing circuit, connected to the one or more horizontal Hall elements, and configured for determining a current flowing through an electrical conductor portion, arranged in the vicinity of said at least one sensor structure. The electrical conductor portion may be integrated inside the current sensor device, or may be located outside of the current sensor device.

In an embodiment, the current sensor device further comprises at least one temperature sensor, e.g. arranged in the vicinity of the centre of the IMC, and the processing circuit may be further configured for temperature correcting the signals obtained from the at least one horizontal Hall element.

In an embodiment, the current sensor device comprises a single substrate comprising a single integrated magnetic concentrator with at least one (e.g. a single, two, three, four or five) horizontal Hall plate, e.g. arranged as illustrated in FIG. 8A or FIG. 8B.

In an embodiment, the current sensor device comprises a single substrate comprising at least two IMC's, each IMC with at least one (e.g. a single, two, three, four or five) horizontal Hall plates. The two integrated IMCs may be oriented in parallel directions (e.g. as illustrated in FIG. 9A), or may be oriented in orthogonal directions (e.g. as illustrated in FIG. 10).

In an embodiment, the current sensor device comprises at least two semiconductor substrates, each substrate comprising a single IMC with at least one (e.g. a single, two, three, four or five) horizontal Hall plate, e.g. as illustrated in FIG. 9B.

In an embodiment, the current sensor device comprises at least two semiconductor substrates, each substrate comprising at least two IMC's, each IMC with at least one (e.g. a single, two, three, four or five) horizontal Hall plates.

In an embodiment, the current sensor device comprises an integrated magnetic sensor structure that comprises an IMC and three horizontal Hall elements (e.g. H1, H2, H3), and a processing circuit configured for determining a current in accordance with the formula: $I = K*(h1+h3-h2)$, or in accordance with the formula: $I = K*(h1+h3-2*h2)$, where K is a predefined constant, h1 and h3 are signals obtained from the second and third horizontal Hall element (H1, H3) located near the ends of the IMC, and h2 is a signal obtained from the horizontal Hall element (H2) located near the centre of the IMC.

In an embodiment, the current sensor device comprises a first integrated magnetic sensor structure including a first IMC and a first horizontal Hall element (e.g. H2$a$) located under the centre of the first IMC, and a second integrated magnetic sensor structure comprising a second IMC and a second horizontal Hall element (e.g. H2$b$) located under the centre of the second IMC; and the processing circuit is configured for determining a current in accordance with the formula: $I = K*(h2a-h2b)$, where K is a predefined constant, h2$a$ is a signal obtained from the first horizontal Hall element (e.g. H2$a$), and h2$b$ is a signal obtained from the second horizontal Hall element (e.g. H2$b$).

In an embodiment, the current sensor has a first IMC and a second IMC, and the first IMC and the second IMC are oriented in parallel, and are located on a single virtual line (X), e.g. as illustrated in FIG. 9.

In an embodiment, the current sensor has a first IMC and a second IMC, and the first IMC and the second IMC are oriented in parallel, and are spaced apart so as to define a virtual rectangle.

In an embodiment, the current sensor has a first IMC and a second IMC, and the first IMC and the second IMC are oriented perpendicular to each other, and spaced apart from each other, e.g. as illustrated in FIG. 10.

The present invention also provides a current sensor system comprising a current sensor device as described above; and an electrical conductor portion (e.g. a busbar) extending in a predefined direction (e.g. Y).

In an embodiment, the integrated magnetic sensor structure comprises three horizontal Hall elements arranged under the IMC, and the IMC is oriented perpendicular to said predefined direction (of the electrical conductor portion).

Preferably this current sensor device is arranged relative to the conductor portion such that a projection of the central horizontal Hall plate (H2) is offset from a central position on the electrical conductor portion, either above the electrical conductor portion, on the edge, or outside of the electrical conductor portion.

In a particular embodiment, the current sensor device is situated relative to the conductor portion such that (i) a projection of the central horizontal Hall plate (H2) is near a transversal edge of the conductor portion, (ii) the second horizontal Hall element (H3) is located substantially halfway between the lateral edges of the conductor portion, and the third horizontal Hall element (H1) is located at a non-zero transversal distance from the conductor portion.

In an embodiment, the current sensor device comprises a first IMC with a first horizontal Hall element arranged under the centre of the first IMC, and a second IMC with a second horizontal Hall element arranged under the centre of the second IMC, arranged in one of the following ways:

i) wherein the first IMC and the second IMC are located on a single virtual line (e.g. X), and the current sensor device is oriented such that the virtual line is oriented perpendicular to said predefined direction (Y);

ii) wherein the first IMC and the second IMC are oriented in parallel to the predefined direction (e.g. Y), and are spaced apart so as to define a virtual rectangle; and wherein the electrical conductor portion has a first and a second transverse cut-out; and wherein the first horizontal Hall element (H2$a$) is situated above the first cutout, and the second horizontal Hall element (H2$b$) is situated above the second cutout;

iii) wherein the electrical conductor portion has a U-shape comprising two legs interconnected by a bridge portion; and wherein the first IMC is oriented perpendicular to the bridge portion and the first horizontal Hall element (e.g. H2$a$) is situated near an outer edge (e.g. e1) of the bridge; and wherein the second IMC is oriented parallel to the bridge and the second horizontal Hall element (e.g. H2$b$) is situated between the two legs in the vicinity of an inner edge (e.g. e2) of the bridge, e.g. as illustrated in FIG. 10.

According to another aspect, the present invention also provides a distance sensor device or a proximity sensor device comprising at least one integrated magnetic sensor structure for measuring a magnetic field gradient signal, e.g. of a magnetic field generated by a magnet which is movable relative to the sensor device. The gradient signal is indicative for a distance between the sensor device and the magnet.

According to another aspect, the present invention also provides a distance sensor system or a proximity sensor system comprising such a sensor device and a magnet or a magnetic structure.

According to another aspect, the present invention also provides a position sensor device comprising at least two integrated magnetic sensor structures for measuring a first magnetic field gradient signal, and a second magnetic field gradient signal, e.g. of a magnetic field generated by a magnet which is movable (e.g. rotatable) relative to the sensor device. The first gradient signal and the second gradient signal may be sinusoidal signals of substantially equal amplitude and substantially 90° phase shifted. The sensor device may be further configured for determining a position (e.g. a linear or angular position) based on a ratio of the first and the second magnetic field gradient.

According to another aspect, the present invention also provides a position sensor system comprising such a sensor device and a magnet or a magnetic structure, e.g. an angular position sensor system or a linear position system.

These and other aspects of the invention will be apparent from and elucidated with reference to the embodiment(s) described hereinafter.

BRIEF DESCRIPTION OF THE DRAWINGS

FIG. 2A to FIG. 2G is a schematic representation of the sensor structure of FIG. 1A, illustrating that the three horizontal Hall elements measure different portions of a magnetic field ambient to the structure.

FIG. 3 shows a set of formulas applicable to the sensor structure of FIG. 1A and FIG. 2A.

FIG. 5A to FIG. 5D show magnetic sensor structures according to embodiments of the present invention. FIG. 5A shows a magnetic sensor structure comprising an elongated IMC and a horizontal Hall element situated under the center of the IMC. FIG. 5B shows a variant of FIG. 5A further comprising a second horizontal Hall element which is not located under the IMC. FIG. 5C shows a variant of FIG. 5A where the IMC has rounded ends, or a circular ends. FIG. 5D shows a variant of FIG. 5A where the IMC has tapered ends, e.g. triangular ends.

as illustrated in FIG. 5A. The two IMCs may have an identical shape and/or size.

Figure 1A:
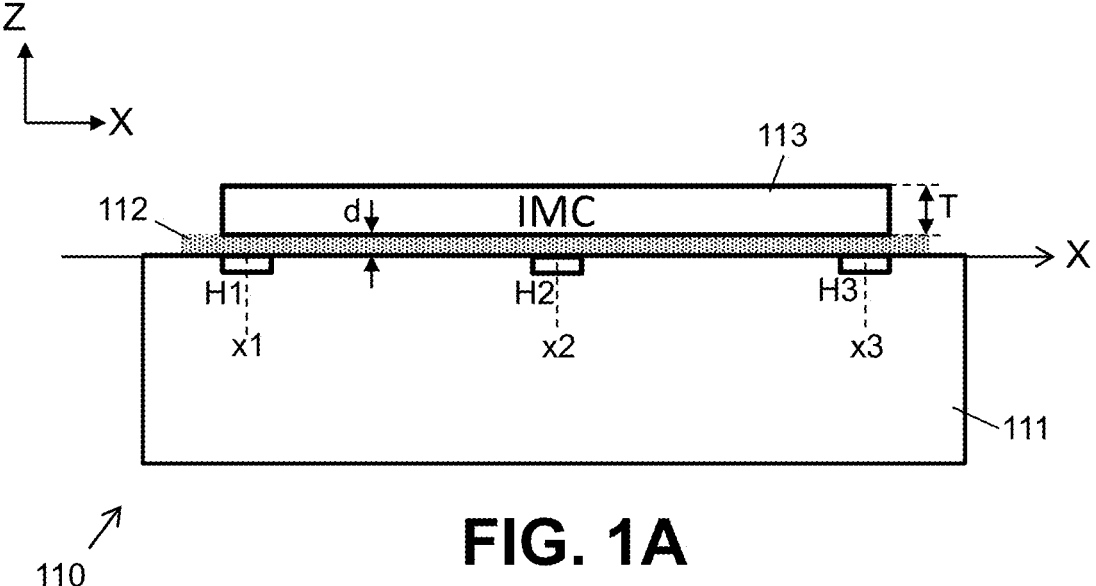
FIG. 1A shows a side view.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, IMC stands for "integrated magnetic flux concentrator".

In this document, the symbol ">>" means "is much greater than".

In this document, the symbol "<<" means "is much smaller than".

In this document, the symbol "≈" means "is approximately equal to".

In this document, the terms "horizontal Hall element" and "horizontal Hall plate" are used as synonyms.

In this document, the expression "magnetic sensor structure" or "magnetic sensor arrangement" may refer to an IMC and one or more horizontal hall elements arranged under the IMC or arranged near a periphery of the IMC. (e.g. at a distance of at most 50 μm).

In this document, unless explicitly mentioned otherwise, the term "magnetic sensor device" refers to a semiconductor device, packaged or unpackaged, comprising at least one such "magnetic sensor structure". The sensor device may be comprised in a package, also called "chip", although that is not absolutely required. The sensor device preferably contains a semiconductor substrate.

In this document, the expression "in-plane component of a magnetic field vector" and "projection of the magnetic field vector in the sensor plane" mean the same. If the sensor device is or comprises a substrate, this also means "magnetic field component parallel to the substrate".

In this document, the expression "out-of-plane component of a vector" and "Z component of the vector" and "projection of the vector on an axis perpendicular to the sensor plane" mean the same.

Embodiments of the present invention are typically described using an orthogonal coordinate system which is fixed to the sensor device, and having three axes X, Y, Z, where the X and Y axis are parallel to the substrate, and the Z-axis is perpendicular to the substrate.

In embodiments of the present invention, the X-axis is preferably oriented in the longitudinal direction of the elongated IMC.

In this document, the expression "spatial derivative" or "derivative" or "spatial gradient" or "gradient" are used as synonyms. In the prior art, a gradient of a certain magnetic field component (e.g. Bz) "along the X-direction" is typically determined as a difference between two such component values (e.g. Bz1, Bz2) measured at two locations spaced apart in the X-direction. In theory the gradient is calculated as the difference between two values divided by the distance "dx" between the sensor locations, but in practice the division by "dx" is often omitted, because the measured signals need to be scaled anyway. The present invention will measure the magnetic field gradient in a different manner, but abstraction is also made of the scaling factor.

In this application, horizontal Hall plates are typically referred to by H1, H2, etc. Signals from these horizontal Hall plates are typically referred to by h1, h2, etc.

The present invention relates to a magnetic sensor structure or a magnetic sensor arrangement for measuring a magnetic field gradient, more specifically an "in-plane magnetic field gradient" (e.g. dBx/dx).

The present invention also relates to a magnetic sensor system comprising one or more such magnetic sensor structures, e.g. a current sensor system, a position sensor system, a torque sensor system.

Figure 1B:
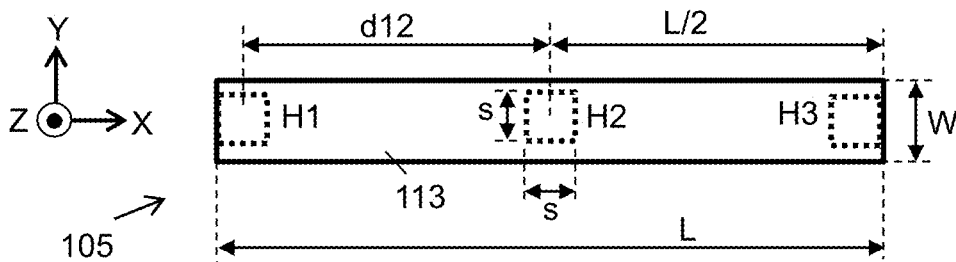
FIG. 1B shows a top view of a magnetic sensor structure according to an embodiment of the present invention, comprising an IMC and three horizontal Hall elements.

FIG. 1A shows a side view, and FIG. 1B shows a top view of a magnetic sensor device 110 comprising a semiconductor substrate 111 and a magnetic sensor structure.

Figure 6:
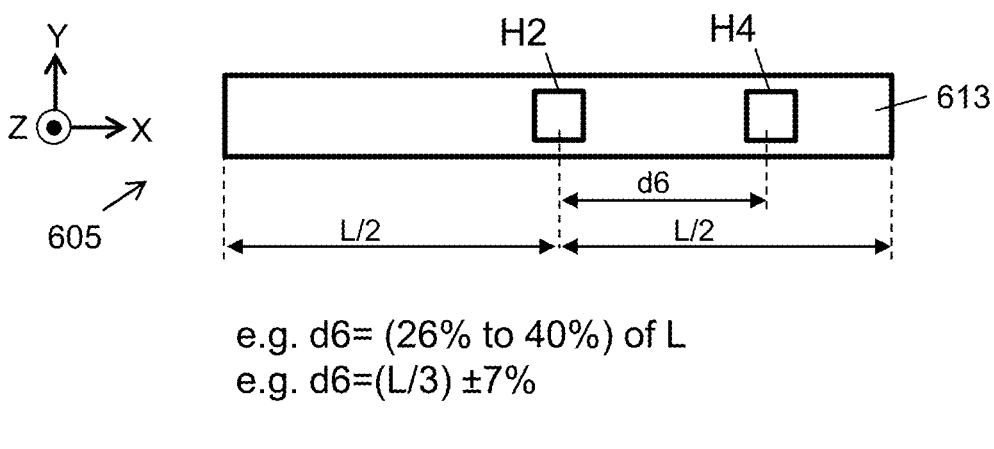
FIG. 6 shows an illustrative example of a magnetic sensor structure comprising an elongated IMC and a first horizontal Hall element situated under the center of the IMC, and comprising a second Hall element located under the IMC, offset from the center, as another embodiment of the present invention.

The magnetic sensor structure of FIG. 1A comprises an integrated magnetic flux concentrator (IMC) 113 and three horizontal Hall elements H1, H2, H3, but the present invention is not limited hereto, and other embodiments may have an IMC with only one horizontal Hall element (see e.g. FIG. 5A), or an IMC with two horizontal Hall elements located under the IMC (see e.g. FIG. 6).

According to an underlying principle of the present invention, one of the horizontal Hall elements, (typically labelled as H2) is located at the centre of the IMC for reasons that will become clear further.

The IMC has a predefined shape with an elongated portion, e.g. a portion having a shape with a rectangular cross section (as seen from above the substrate). The ends of the rectangular portion may have straight corners, but that is not absolutely required, see e.g. FIG. 5C where the IMC has rounded ends, and FIG. 5D where the IMC has tapered ends, e.g. triangular ends.

Figure 7:
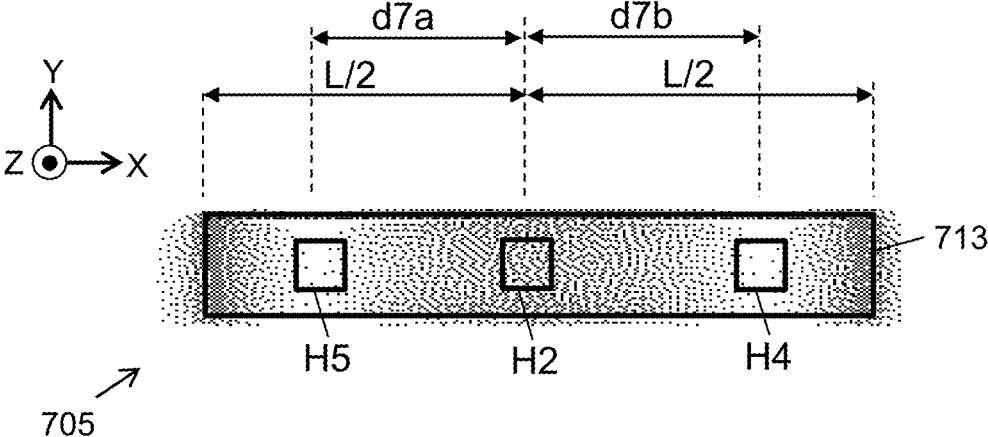
FIG. 7 shows an illustrative example of a magnetic sensor structure comprising an elongated IMC and a first horizontal Hall element situated under the center of the IMC, and comprising a second and a third horizontal Hall element located under the IMC, both offset from the center, as another embodiment of the present invention.

In the example of FIG. 1A the two other horizontal Hall elements H1, H3 are located near the ends of the elongated IMC, but that is not absolutely required, e.g. as illustrated in FIG. 7, where the two other horizontal Hall elements H1, H3 are positioned on opposite sides of the central element H2, but not necessarily at a distance equal to half of the length L of the elongated structure.

In FIG. 1B, the centers of the Hall elements H1 and H3 are preferably offset from the center of the IMC by a distance d12 in the range from L*41% to L*50%. This means that the Hall elements H1 and H3 do not need to be located completely under the IMC (or stated in other words, the IMC does not need to fully overlap the Hall element). In certain embodiments, the Hall elements H1 to H3 are located completely under the IMC. In this case, the distance d12 is smaller than (L/2)–(s/2). In certain embodiments, the IMC partially overlaps the Hall plate, e.g. by 1% to 50% of the area of the Hall element.

Referring back to FIG. 1A and FIG. 1B, the IMC may have a thickness T in the range from 15 μm to 29 μm, or from 18 μm to 25 μm, e.g. equal to 20±1 μm, or equal to about 22±1 μm.

The IMC may have a length L in the range from 60 μm to 1000 μm, or from 100 μm to 1000 μm, or from 200 μm to 1000 μm, or from 400 μm to 800 μm.

The IMC may have a width W in the range from 24 μm to 200 μm, or from 30 μm to 175 μm, or from 40 μm to 150 μm, e.g. equal to about 100 μm.

The IMC layer may contain a soft-magnetic material, e.g. consisting of or comprising an Fe—Ni alloy, or an Fe—Co alloy.

In preferred embodiments, the ratio L/W of the length and the width may be a value in the range from 3.0 to 20.0, e.g. at least 4.0, or at least 6.0, or at least 8.0, or at least 10.0; and at most 20.0, or at most 18.0, or at most 15.0.

The horizontal Hall element may have a mainly square plate having a length and width "s" of about 15 μm to about 25 μm. Preferably the width W of the IMC is equal to or larger than the width "s" of the horizontal Hall element, e.g. at least 20% larger than the width of the horizontal Hall plates, or at least 50% larger.

The horizontal Hall elements are preferably implemented in an active surface of a semiconductor substrate 111. The IMC 113 and the horizontal Hall elements are preferably separated by an insulating layer 112, e.g. by a polymer layer, e.g. by a polyimide layer. Methods of producing a semiconductor substrate 111 comprising horizontal Hall elements, and for depositing an insulating layer 112, and for depositing a layer of a magnetic material for the IMC 113 (e.g. by sputtering or by electroplating or both) are known in the art, and hence need not be explained in more detail here.

Figure 2A:
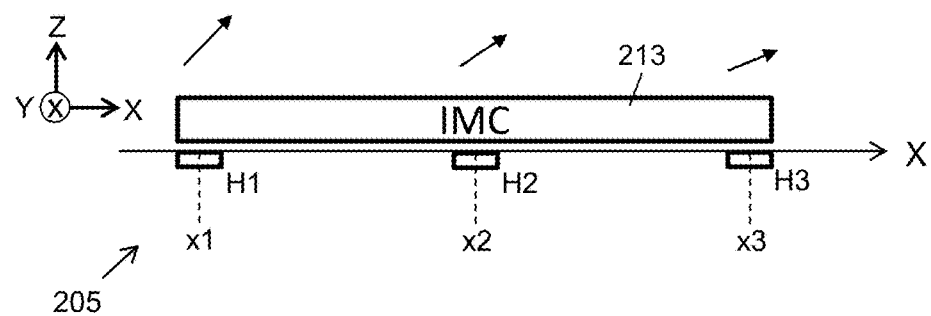
Figure 2A:
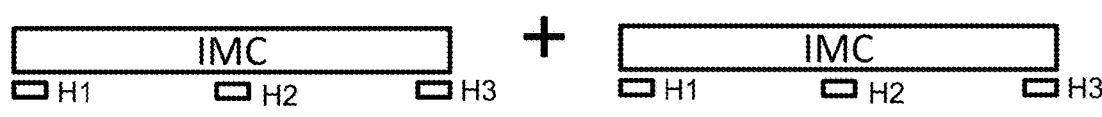
Figure 2A:
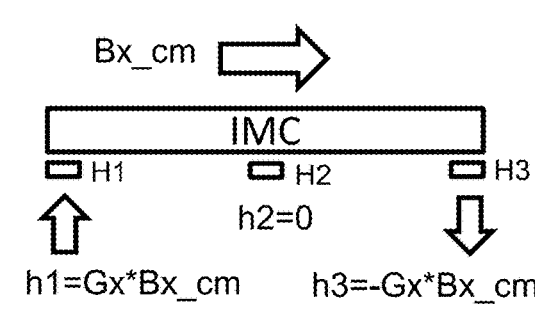
Figure 2A:
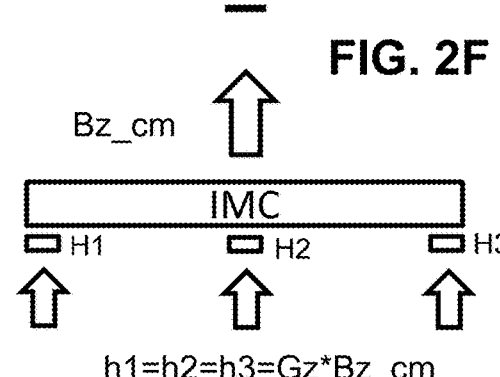
Figure 2A:
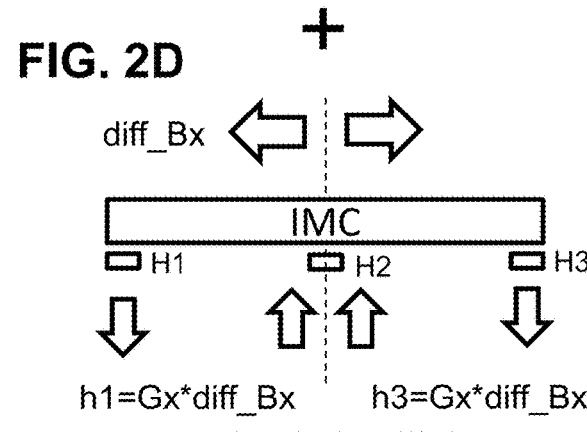
Figure 2A:
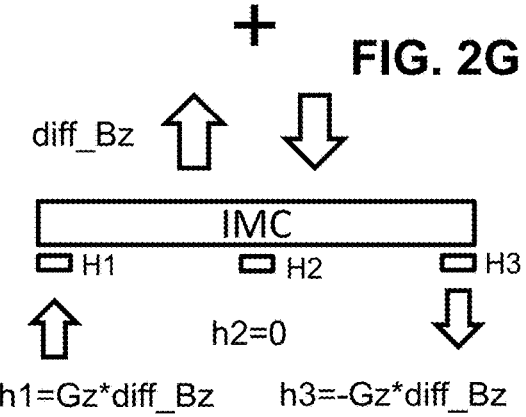

FIG. 2(a) shows the elements of the magnetic sensor structure 205 of FIG. 1A, comprising an IMC 213 having an elongated shape or an elongated portion (e.g. a rectangular portion), and at least one horizontal Hall element H2 located in the middle under the IMC 213, but in the examples of FIG. 1A and FIG. 2(a) furthermore comprises two horizontal Hall elements H1, H3 located proximate to the ends of the elongated shape.

It is known that a magnetic sensor structure comprising a circular IMC and two horizontal Hall elements located near the periphery of the IMC, and spaced apart by 180°, can be used to measure a magnetic field component Bx oriented parallel to the substrate (e.g. by subtracting and scaling the signals obtained from the Hall elements) and a magnetic field component Bz oriented perpendicular to the substrate (e.g. by summing and scaling said signals). It is also known that a device comprising two circular IMCs spaced apart along an X-axis, each having two horizontal Hall elements located on the X-axis, thus four horizontal Hall elements in total, can be used to determine a magnetic field gradient dBx/dx and a magnetic field gradient dBz/dx, for example from EP3650816 (A1).

The inventors of the present invention have surprisingly discovered, however, that the signal h2 obtained from the horizontal Hall element H2 that is located under the center (or middle) of the elongated IMC 213 of FIG. 2(a), can be used to determine the magnetic field gradient dBx/dx at the location x2 at the center of the IMC, as will be explained next. As far as is known to the inventors, this effect is not known in the prior art.

While the inventors do not wish to be bound by any theory, FIG. 2(b) to FIG. 2(g) illustrate how certain aspects of a magnetic field surrounding the IMC 213 may be measured by the horizontal Hall elements H1, H2 and H3. In the drawing it is assumed that the magnetic field surrounding the IMC can be approximated by a common-mode portion and a differential portion (or gradient portion). This magnetic sensor structure is not sensitive to a magnetic field oriented in the Y-direction (perpendicular to the page), but is sensitive to a magnetic field oriented in the X-direction and/or the Z-direction.

FIG. 2(b) illustrates how a magnetic field oriented in the X-direction can be decomposed in a common-mode portion Bx_cm and a gradient portion diff_Bx.

FIG. 2(c) shows how the common-mode portion can be sensed by the Hall sensors H1, H2, H3, namely as signals: h1=Gx*Bx_cm; h2=0; h3=–Gx*Bx_cm, respectively, where Gx is a first gain factor, i.e. a first predefined constant, which may be determined by simulation, or during a measurement or during a calibration test, and may optionally be stored in a non-volatile memory of the semiconductor device.

FIG. 2(d) shows how the differential portion can be sensed by the Hall elements H1, H2, H3, namely as signals: h1=Gx*diff_Bx; h2–2*Gx*diff_Bx; h3=Gx*diff_Bx, respectively.

FIG. 2(e) illustrates how a magnetic field oriented in the Z-direction can be decomposed in a common-mode portion Bz_cm and a gradient portion diff_Bz.

FIG. 2(f) shows how the common-mode portion can be sensed by the Hall sensors H1, H2, H3, namely as signals: h1=Gz*Bz_cm; h2=Gz*Bz_cm; h3=Gz*Bz_cm, where Gz is a second gain factor, i.e. a second predefined constant, which may be determined by simulation, measurement or during a calibration test, and which may optionally be stored in the non-volatile memory of the semiconductor device.

FIG. 2(g) shows how the differential portion diff_Bz will be sensed by the Hall elements H1, H2, H3, namely as signals: h1-Gz*diff_Bz; h2=0; h3=–Gz*diff_Bz.

FIG. 3 shows a set of formulas applicable to the sensor structure of FIG. 1A and FIG. 2(a). These formulas can be obtained by adding for each of the signals h1, h2, h3 the portions shown in FIG. 2(c), FIG. 2(d), FIG. 2(f) and FIG. 2(g), and by considering that Bx_cm corresponds to Bx, that diff_Bx corresponds to dBx/dx, Bz_cm corresponds to Bz, and diff_Bz corresponds to dBz/dx.

Formula [4a] can be obtained by adding the formulas [1] and [3], and may be simplified to formula [4b] if the gradient-term is small relative to the component-term.

Formula [5] can be obtained by adding 2* formula [2] and subtracting formula [4a].

Formula [6a] can be obtained by subtracting the formulas [1] and [3], and may be simplified to formula [6b] if the gradient-term is small relative to the component-term.

It will be appreciated that the gradient (dBx/dx) can be calculated or estimated based on formula [2], and thus from the signal h2 obtainable from the horizontal Hall element H2 situated in the middle of the IMC, e.g. in case the value of Bz is zero or relatively small compared to the value of (dBx/dx), or if the value of Bz is measured and subtracted otherwise (see e.g. FIG. 5B, FIG. 9A, FIG. 9B, FIG. 10).

It will be appreciated that the gradient (dBx/dx) may also be calculated based on formula [5], which is applicable even if Bx≠0 and/or Bz≠0 and/or (dBz/dx)≠0.

Figures 4A, 4B, 4C, 4D:
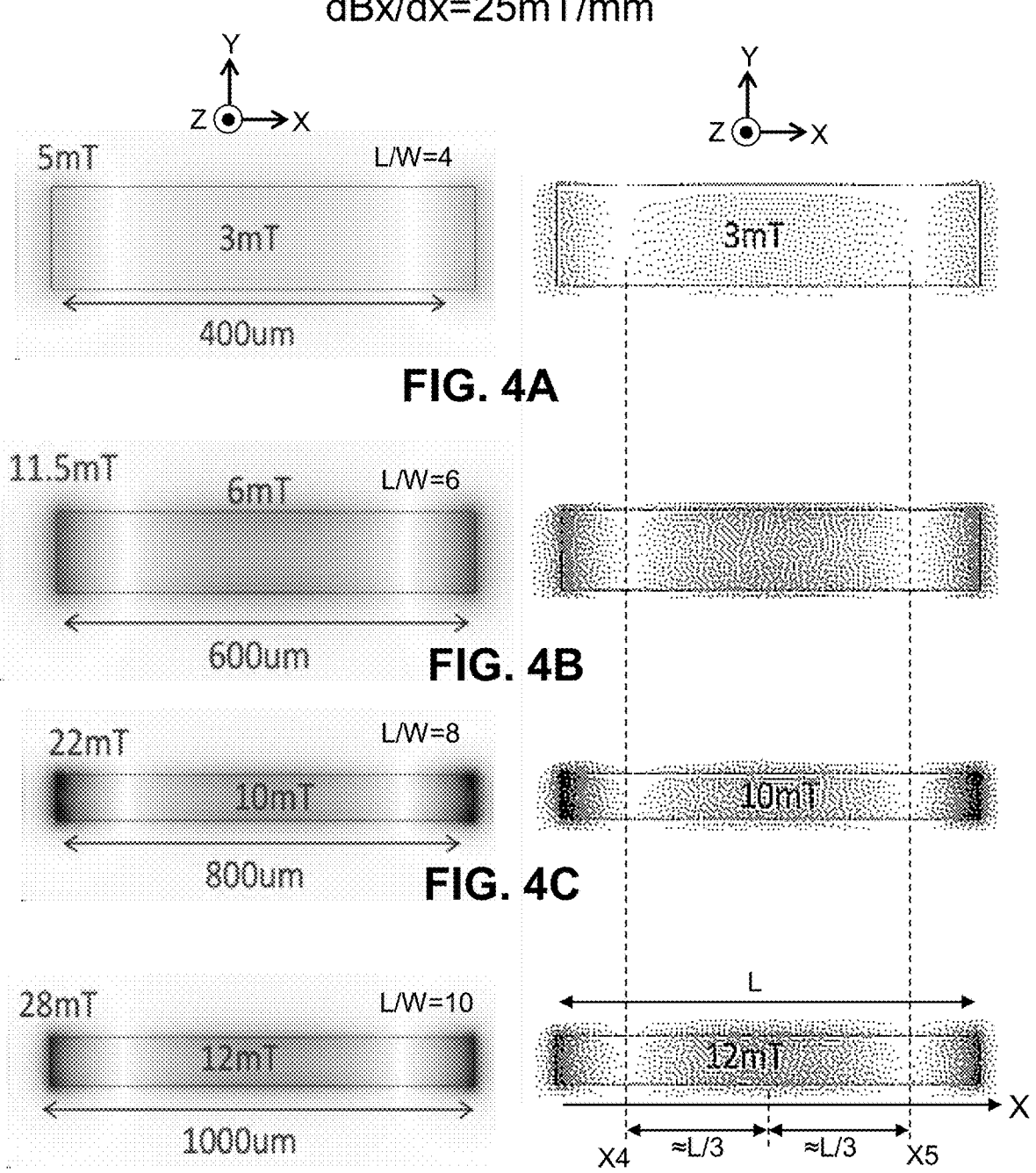
FIG. 4A to FIG. 4D show simulation results illustrating the magnitude of the signal that can be measured by a horizontal Hall element that is located under the IMC, as a function of the position along the X-axis, when a magnetic field with a pure gradient dBx/dx of 25 mT/mm is applied.

FIG. 4(a) to FIG. 4(d) show simulation results performed for a magnetic sensor structure as illustrated in FIG. 1A and FIG. 2(a) with three horizontal Hall elements H1, H2, H3, where a magnetic field is applied with no common-mode value, but a pure gradient dBx/dx of 25 mT/mm, and where the IMC is made of an Fe—Ni alloy, and has a thickness T of 20 μm, and a width W of 100 μm, for various lengths of the IMC. The following numerical results were obtained:

In FIG. 4(a): L=400 μm, (thus L/W=4), |h2|=3 mT, |h1|=|h3|=5 mT.

In FIG. 4(b): L=600 μm, (thus L/W=6), |h2|=6 mT, |h1|=|h3|=11.5 mT.

In FIG. 4(c): L=800 μm, (thus L/W=8), |h2|=10 mT, |h1|=|h3|=22 mT.

In FIG. 4(d): L=1000 μm, (thus L/W=10), |h2|=12 mT, |h1|=|h3|=28 mT.

Two pictures are shown in each case for illustrative purposes: a grayscale picture on the left, and a dithered picture on the right.

Very surprisingly, these simulations also showed that there are two locations, indicated by X4 and X5, (also referred to herein as "white zones"), where a horizontal Hall element (if placed at that location/these locations) would be insensitive to (Bx) and to (dBx/dx), but only to (Bz) and to (dBz/dx). As far as is known to the inventors, this effect is not known in the art.

In practice the amplitude of Bz is typically an order of magnitude larger than that of dBz/dx, meaning that the signals h4 and h5 measured by horizontal Hall elements located at X4 and X5 are insensitive to (Bx) and to (dBx/dx), but mainly depend on (Bz).

Even if the gradient (dBz/dx) would not be very small, the sum of the signals (h4+h5) that can be obtained from two horizontal Hall elements H4, H5 located at the locations X4, X5, (e.g. as illustrated in FIG. 7) would reduce or even completely cancel the influence of dBz/dx, i.e. that (h4+h5) is only sensitive to Bz, but not to (dBz/dx), not to (Bx) and not to (dBx/dx).

As can be appreciated from FIG. 4(a) to FIG. 4(d), these "white zones" are located at a distance of approximately L/3 from the centre of the IMC, e.g. within a tolerance margin of ±3%. Neither the existence of these locations, nor their position was known in the art.

FIG. 5A shows a magnetic sensor structure 505a comprising an elongated IMC 513a and a single horizontal Hall element H2 situated under the center of the IMC. As explained above, in an environment where the influence of Bz is not very large at the location of H2, the signal h2 obtained from the horizontal Hall element H2 can be used as an estimate or as an indication for the magnetic field gradient (dBx/dx), e.g. in accordance with the formula: h2≈2*Gx* (dBx/dx), where Gx is a predefined constant, and the symbol ≈ means "is approximately equal to". Of course this can also be written as: h2≈Ax*(dBx/dx), where Ax is a predefined constant.

FIG. 5B shows a variant of FIG. 5A further comprising a second horizontal Hall element H6 which is not located under the IMC, but is spaced by a distance d5x from the center of the IMC in the X-direction, and is spaced by a distance d5y from the center of the IMC in the Y-direction. In the example shown, the value of d5x is different from zero, but that is not absolutely required, and in a variant of FIG. 5B the value of d5x is equal to zero. The value of d5y may be a value in the range from 2*W to 5*W, where W is the width of the IMC. Using formula [2] of FIG. 3, the signal h2 obtained from the horizontal Hall element H2 may be written as: h2=2*Gx*(dBx/dx)+Gz*(Bz_2), where Bz_2 is the signal Bz at the location of H2; and the signal h6 obtained from the horizontal Hall element H6 may be written as: h6=Bz_6 (no explicit scaling factor is mentioned here, because the signal h6 is not passively amplified by the IMC). By subtracting the value h6 from the value h2, optionally after scaling one or both of h2 and h6 in the analog or digital domain, the influence of Bz_2 can be substantially or completely eliminated.

In practice, the value of Bz_2 and Bz_6 are typically approximately the same, and the value of Gz is typically close to 1.0. In other words, the magnetic sensor structure 505b of FIG. 5B is capable of measuring the gradient (dBx/dx) while reducing or substantially eliminating common-mode signals.

In a variant of FIG. 5B (not shown), the structure has a third horizontal Hall element H7, arranged such that H2 is situated in the middle between H6 and H7. The value of Bz_2 can then be approximated by averaging the signals h6 and h7 obtained from the Hall elements H6 and H7 respectively. The signal h2−K*avg (h6,h7) is an approximation for 2*Gx* (dBx/dx), even if Bz is not equal to zero, and even if Bz varies in the X or Y direction, where avg ( ) means "average of", and K is a predefined constant, which may be equal to 1.00 or may be different from 1.00, e.g. a value in the range from 0.90 to 0.98 or a value in the range from 1.02 to 1.10. The virtual line passing through H6 and H7 may be oriented perpendicular to the elongated direction X of the IMC, but that is not absolutely required.

FIG. 5C and FIG. 5D are a few illustrative examples showing that the IMC in embodiments of the present invention has an elongated portion, preferably a rectangular or beam shaped portion, but does not need to be a perfect beam shape over its entire length. FIG. 5C shows a variant of FIG. 5A where the IMC 513c has rounded ends or circular ends. FIG. 5D shows a variant of FIG. 5A where the IMC 513d has triangular ends. But other shapes, e.g. tapering ends, or widening ends (i.e. broader width near its ends) are also possible.

The magnetic sensor structures 505c, 505d illustrated in FIG. 5C and FIG. 5D have only one horizontal Hall element H2 located at the center of the IMC, but of course, further horizontal Hall elements may also be added to this structure, e.g. one or both of H1 and H3 near the ends (e.g. as illustrated in FIG. 1B), H6 outside of the IMC (e.g. as illustrated in FIG. 5B), H6 and H7 outside the IMC such that H2 is located in the middle between H6 and H7 (as described as a variant of FIG. 5B), one or both of H4 and H5 in the "white zones" (e.g. as illustrated in FIG. 7), or combinations hereof.

FIG. 6 shows an illustrative example of a magnetic sensor structure 605 comprising an elongated IMC 613 and a first horizontal Hall element H2 situated under the center of the IMC, and a second Hall element H4 located under the IMC, at a distance d6 from the center. The sensor structure of FIG. 6 can be seen as a variant of the sensor structure of FIG. 5B, where the second horizontal Hall element is shifted under the IMC, preferably in the "white zone". In preferred embodiments, d6 is a value in the range from L*0.30 to L*0.36, or stated in other words: preferably the distance d6 is equal to L/3 with a tolerance margin of ±3%. A processing circuit (not explicitly shown in FIG. 6, but see e.g. FIG. 11) connected to these Hall elements may be configured to determine (e.g. calculate) a signal or value s6 as a difference between the signal h2 obtained from H2 and the signal h4 obtained from H4, e.g. in accordance with the formula s6=(h2−h4). This signal or value s6 can be used as an approximation of $2*Gx*(dBx/dx)$, and has a reduced sensitivity to a common-mode signal.

FIG. 7 shows an illustrative example of a magnetic sensor structure 705 comprising an elongated IMC 713 and a first horizontal Hall element H2 situated under the center of the IMC, and comprising a second and a third horizontal Hall element H4, H5 located under the IMC, offset from the center by a distance d7b and d7a respectively. Preferably the distance d7a is equal to the distance d7b. The value of this distance may be a value in the range from $L*26\%$ to $L*40\%$, or a value in the range from $L*30\%$ to $L*36\%$, or a value in the range of $(L/3)\pm7\%$ or $\pm5\%$ or $\pm3\%$. The sensor structure 705 of FIG. 7 can be seen as a variant of the sensor structure of FIG. 6, further comprising a third horizontal Hall element H5 located under the IMC, in the second "white zone". A processing circuit (not explicitly shown in FIG. 7, but see e.g. FIG. 11) connected to these Hall elements may be configured to determine (e.g. calculate) a signal or value s7 in accordance with the following formula $s7=2*h2-(h4+h5)$. This signal or value s7 can be used as an approximation of $4*Gx*(dBx/dx)$, and has a reduced sensitivity to a common-mode signal.

Figure 8A:
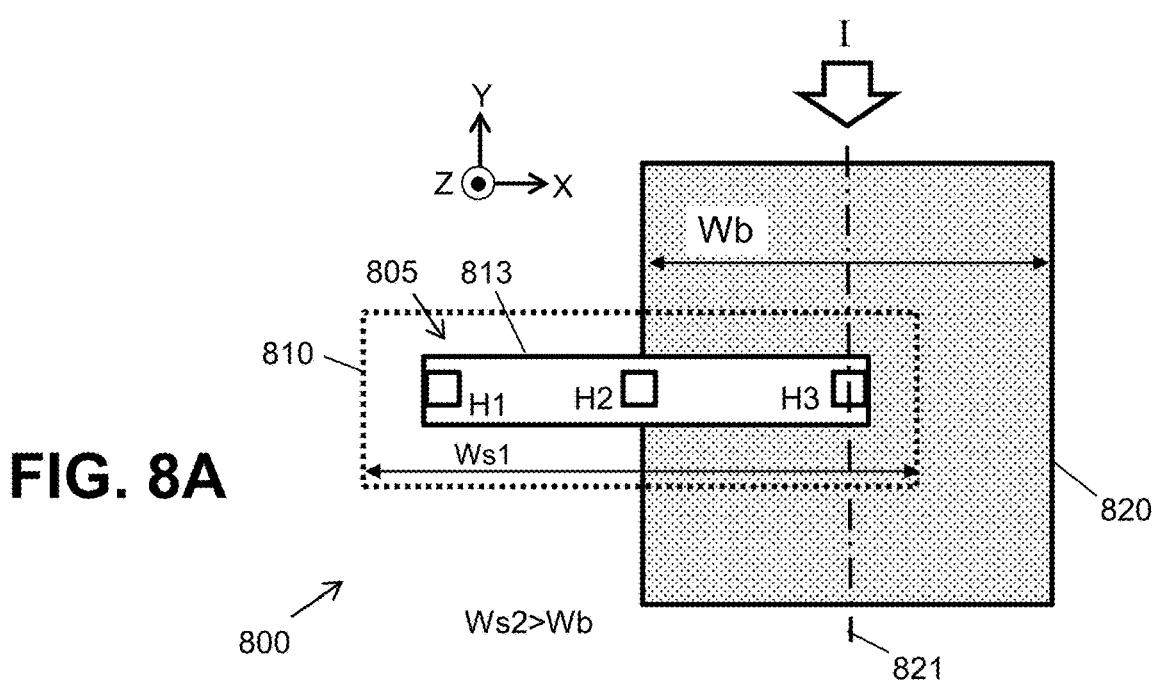
FIG. 8A and FIG. 8B show two illustrative examples of a current sensor system comprising a magnetic sensor structure as illustrated in FIG. 1A or FIG. 2(a), comprising an IMC and three horizontal Hall elements, one located at the center, and two located near outer ends of the IMC.
Figure 8B:
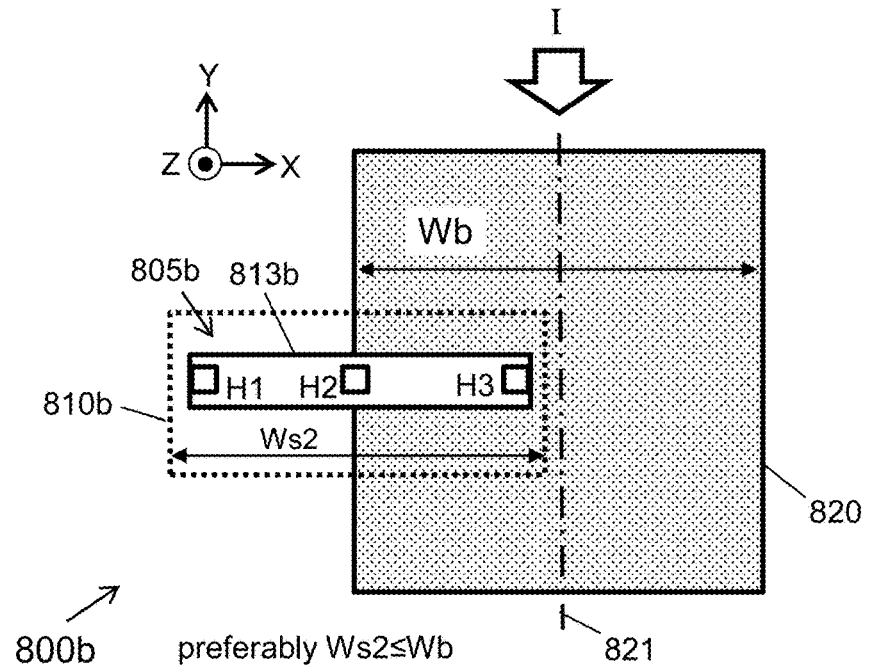

FIG. 8A and FIG. 8B show two illustrative examples of a current sensor system 800, 800b comprising an electrical conductor portion 820, e.g. a busbar, and a magnetic sensor structure 805 similar to that of FIG. 1A or FIG. 2(a), each magnetic sensor structure comprising an IMC and three horizontal Hall elements H2, H1, H3, one (H2) located at the center, and two (H1, H3) located near outer ends of the IMC. The magnetic sensor structure 805 may be implemented in a semiconductor substrate 810. This semiconductor substrate may be incorporated in a sensor device (not explicitly shown), e.g. a packaged sensor device also known as "chip".

Preferably the IMC 813 is oriented with its longitudinal direction X perpendicular to the direction Y of the current flowing through the conductor 820. Or stated in other words, the IMC 813 is preferably oriented in a transverse direction of the busbar 820.

In the example of FIG. 8A, the sensor structure 805 is positioned such that the element H2 is situated near a lateral edge of the busbar 820, but that is not absolutely required. It suffices that the central Hall element H2 is situated offset from the centerline 821 of the busbar. In the example of FIG. 8A, the horizontal Hall element H3 is located substantially at a centerline 821 of the busbar 820, but that is not required either, and the Hall element H3 may be located at a non-zero offset from the centerline 821. In the example shown in FIG. 8A, the semiconductor substrate 810 comprising the sensor structure 813 has a width Ws1 which is larger than a width Wb of the busbar, but that is not required either.

The semiconductor substrate 810 may further comprise a processing circuit configured for determining a signal s8 in accordance with the formula $s8=(h1+h3-h2)$, or may be configured for determining a signal s8' in accordance with the formula $s8'=(h1+h3-2*h2)$. The signal s8 and even more so s8' is mainly dependent on gradient signals, and is largely independent of common-mode signals, hence is substantially independent of an external disturbance field, if present.

Figure 11:
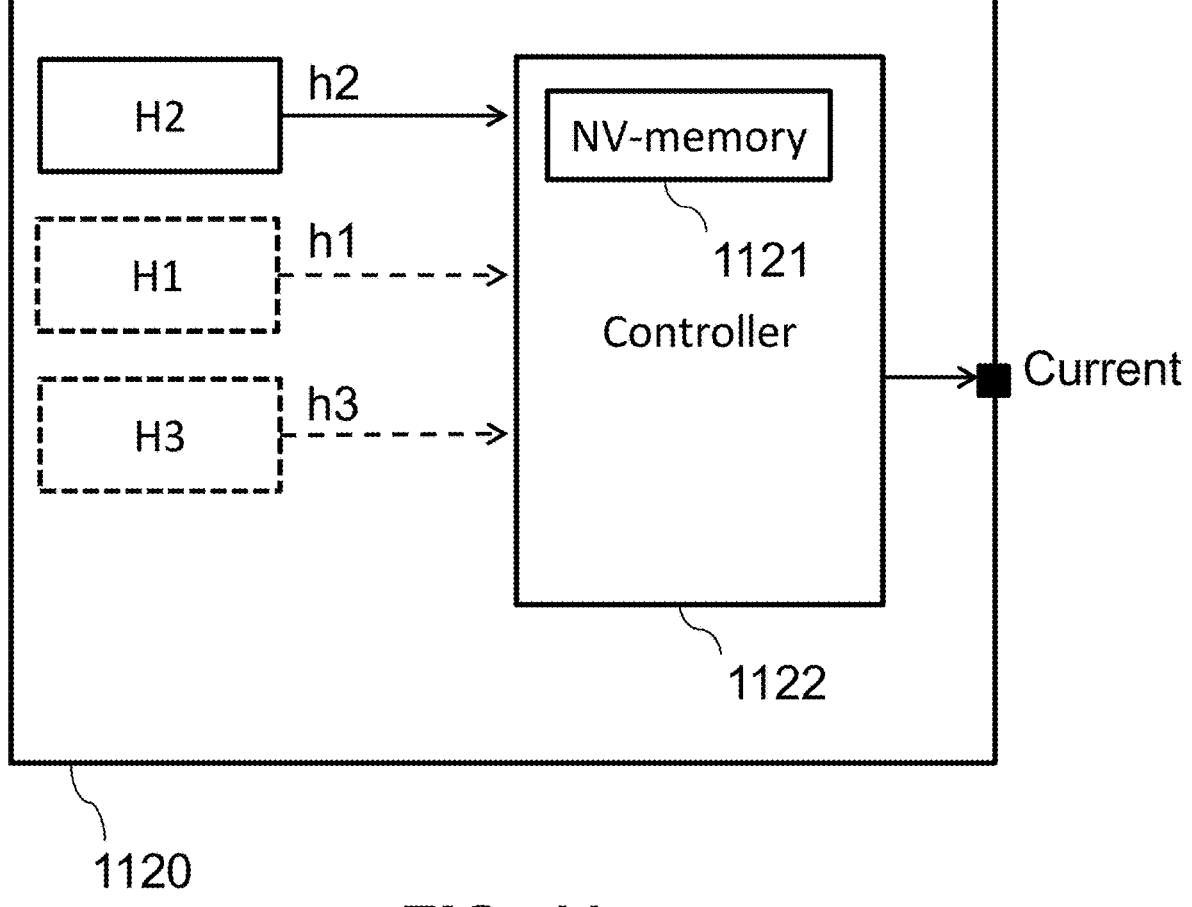
FIG. 11 shows a high-level block diagram of a magnetic sensor device that includes one or more of the sensor structures described above.

The current which flows through the electrical conductor 820 may be calculated in accordance with the formula $I8=K8*(h1+h3-h2)$, or in accordance with the formula $I8'=K8'*(h1+h3-2*h2)$, where K8 and K8' are predefined constants, which may be determined by design, by simulation, or determined during a calibration procedure, and may be hardcoded or may be stored in a non-volatile memory of the sensor device (see e.g. FIG. 11).

In a variant of FIG. 8A, the Hall elements H1 and H3 are not located near the ends of the IMC (e.g. as illustrated in FIG. 1B), but are located in the "white zones" of the IMC (e.g. as illustrated in FIG. 7).

FIG. 8B shows a sensor system 800b which is a variant of the sensor system 800 of FIG. 8A, having a semiconductor substrate 810b comprising a sensor structure 805b similar to that of FIG. 1A or FIG. 2(b). The Hall element H2 is preferably located in the vicinity of a lateral edge of the busbar 820, but that is not absolutely required. The Hall element H3 is located between said lateral edge and the centerline 821 of the busbar. The semiconductor substrate 810b of FIG. 8B preferably has a width Ws2 which is smaller than or equal to the width Wb of the busbar 820. In an embodiment, this semiconductor substrate 810b is incorporated in a packaged integrated sensor device ("chip"), and the size of the chip (in the transversal direction of the busbar) is smaller than or equal to the width Wb of the busbar.

The same formulas as mentioned in FIG. 8A are also applicable here, but the values of the predefined constants K8, K8' may be different.

In other variants of FIG. 8A and FIG. 8B, the substrate 810 or 810b may comprise a sensor structure as illustrated in FIG. 7, and the current I may be determined in accordance with the formula: $I=K8''*[2*h2-(h4+h5)]$, where K8'' is a predefined constant, which may be determined by design, or by simulation, or during a calibration procedure, and h2, h4, h5 are signals obtained from the central Hall element H2, and from the other two Hall elements H4, H5 respectively.

In a variant of FIG. 8B, the Hall elements H1 and H3 are not located near the ends of the IMC (e.g. as illustrated in FIG. 1B), but are located in the "white zones" of the IMC (e.g. as illustrated in FIG. 7).

Figure 9A:
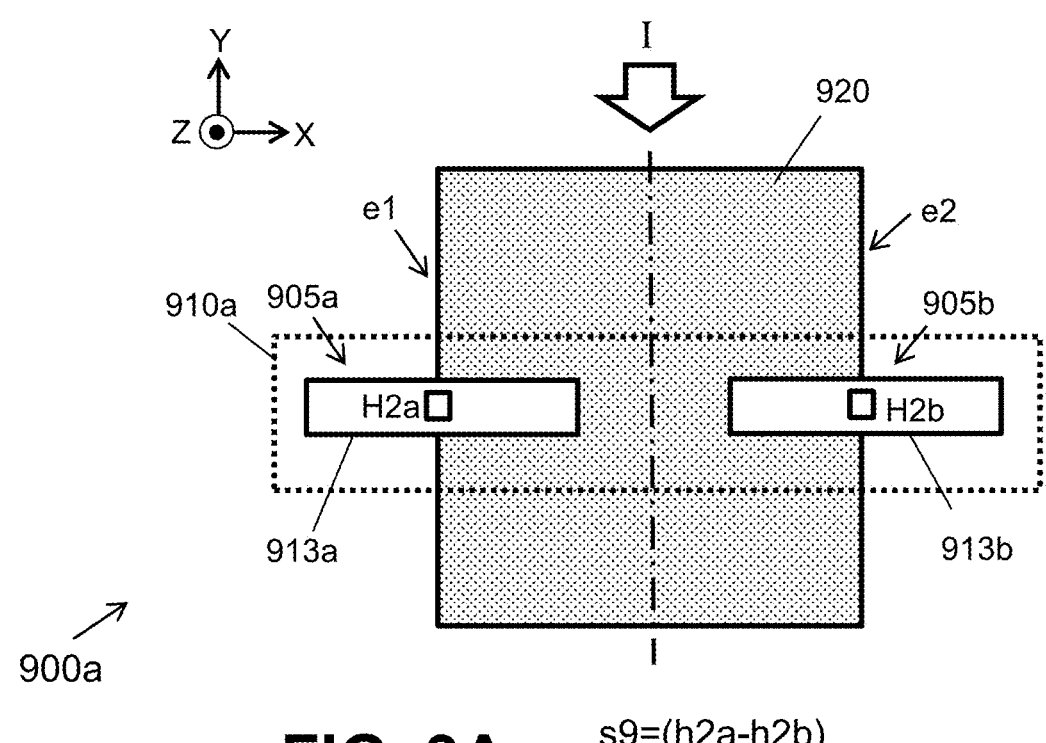
FIG. 9A and FIG. 9B show two illustrative examples of a current sensor system comprising a straight busbar and two magnetic sensor structures located on opposite sides of the busbar, and oriented in a direction perpendicular to the direction of current flow. The magnetic sensor structures each comprise an IMC and a horizontal Hall element located in the middle of the IMC, e.g.

FIG. 9A shows an illustrative example of a current sensor systems 900a comprising an electrical conductor portion 920a, e.g. a portion of a busbar, and two magnetic sensor structures 905a, 905b similar to those illustrated in FIG. 5A, preferably implemented in a semiconductor substrate 910a. The magnetic sensor structures 905a, 905b each comprise an IMC 913a, 913b and one horizontal Hall element H2a, H2b located in the middle of the respective IMC. As can be seen, the flux concentrators 913a and 913b are oriented in the X-direction, perpendicular to the Y-direction, i.e. in the direction of the current flow, or in a transverse direction of the conductor portion 920a. Preferably the two IMCs 913a, 913b have an identical shape and size.

In the example of FIG. 9A, the sensor structures 905a, 905b are arranged such that the Hall element H2a is located substantially above a first edge e1 of the conductor portion 920a, and such that the Hall element H2b is located substantially above a second edge e2 of the conductor portion 920a. The Hall elements H2a, H2b may be connected to a processing circuit (not shown) that may be configured for determining a signal or value s9 in accordance with the formula $s9=(h2a-h2b)$, where h2a is the signal obtained from Hall element H2a, and h2b is the signal obtained from Hall element H2b. The processing circuit may be implemented in the same (e.g. single) substrate 910a, or in another substrate operatively connected to the substrate 910a, and in the latter case, preferably incorporated in the same packaged device (e.g. chip, not shown). The processing circuit may be configured for determining a current I in accordance with the formula $I=K9*(h2a-h2b)$, where K9 is a predefined constant which may be determined by design, or by simulation, or during a calibration procedure, and which may be stored in a non-volatile memory of the sensor device, which may also be implemented in the same semiconductor substrate.

Many variants are possible. In the example of FIG. 9A, the two sensor structures 905a and 905b are implemented on a single semiconductor substrate 910a, but that is not absolutely required, and in a variant, they may be implemented in two separate substrates 910c, 910d. These two separate substrates may be incorporated in a single packaged device, or may be implemented in two separate chips (not shown).

Figure 9B:
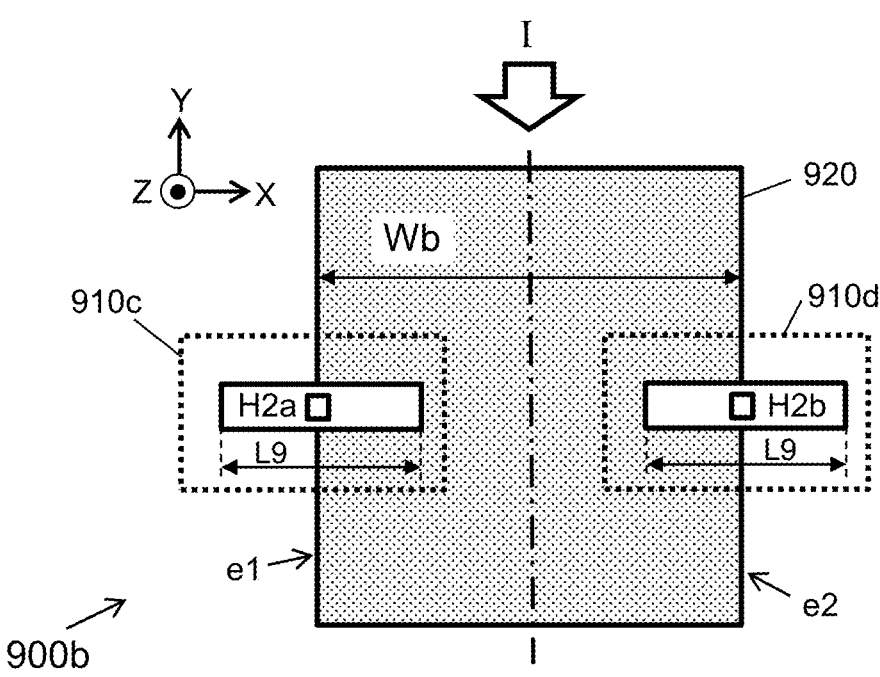

In the example of FIG. 9A and FIG. 9B, the two IMCs and the Hall elements H2a, H2b are located above the edges e1, e2 of the electrical conductor portion 920b, but that is not absolutely required, and the IMCs and the Hall elements H2a, H2b may be slightly shifted inwardly or outwardly.

In the example of FIG. 9A, the length L9 of the IMCs is slightly larger than Wb/2 (where Wb is the width of the busbar portion), but that is not absolutely required. In the example of FIG. 9B, the length L9 of the IMCs is substantially equal to, or smaller than Wb/2. The same formulas as mentioned in FIG. 9A are also applicable in FIG. 9B, but the value of K9 may be different. In the embodiment of FIG. 9A and FIG. 9B, and their variants, the current sensor is mainly sensitive or only sensitive to magnetic field gradients, i.e. that they are highly independent of an external disturbance field, if present.

Figure 10:
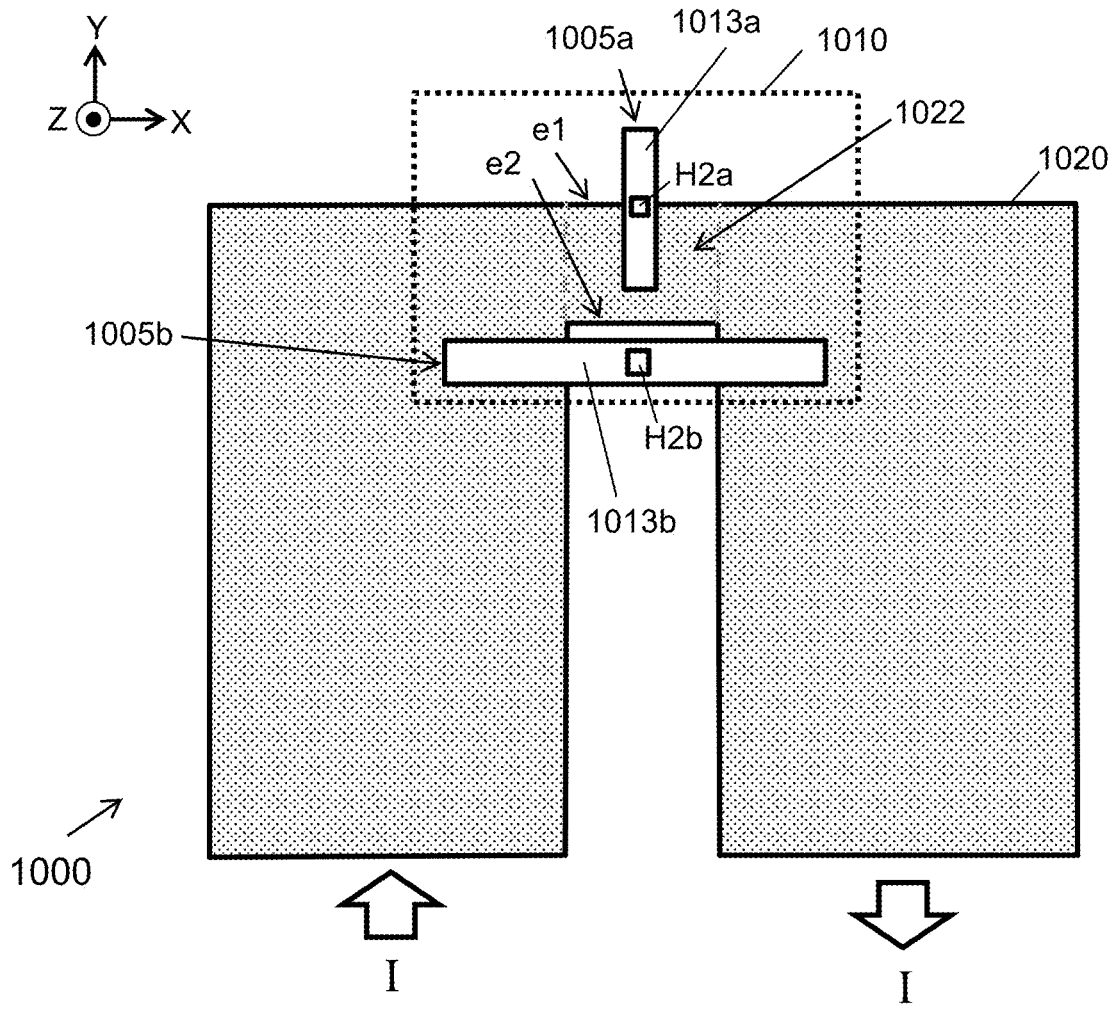
FIG. 10 shows an illustrative example of a current sensor system comprising a U-shaped busbar and two magnetic sensor structures as illustrated in FIG. 5A.

FIG. 10 shows an illustrative example of a current sensor system 1000 comprising a U-shaped conductor portion 1020, and two magnetic sensor structures 1005a and 1005b similar to that of FIG. 5A.

The U-shaped busbar 1020 may have two elongated leg portions (extending in the Y-direction) and interconnected by a bridge portion 1022 extending in the X-direction. Each magnetic sensor structure 1005a, 1005b comprises an IMC and a horizontal Hall element H2a, H2b located in the middle of the respective IMC. The two IMCs may have a different size and/or shape.

The first sensor structure 1005a has a first IMC oriented in the Y-direction, parallel to the leg portions and perpendicular to the bridge portion 1022, and the first horizontal Hall element H2a located near the middle of the first IMC may be situated near an outer edge e1 of the bridge portion 1022.

The second sensor structure 1005b has a second IMC oriented in the X-direction, perpendicular to the leg portions and parallel to the bridge portion 1022, and the second horizontal Hall element H2b located near the middle of the second IMC may be situated near an inner edge e2 of the bridge portion.

A processing circuit (not shown) may be connected to the Hall elements H2a, H2b, and may be configured for calculating a signal s10 in accordance with the formula s10= (h2a−h2b), and/or may be configured for determining a current I in accordance with the formula: I=K10*(h2a−h2b), where h2a is a signal obtained from the Hall element H2a, h2b is a signal obtained from the Hall element H2b, and K10 is a predefined constant which may be determined by design, by simulation, or during a calibration procedure, and may be stored in a non-volatile memory connected to the processing circuit (e.g. as illustrated in FIG. 11). The signal s10 and/or the current I determined in this manner is mainly dependent on magnetic field gradients, i.e. is substantially independent of an external disturbance field, if present.

In the example of FIG. 10, the two sensor structures 1005a and 1005b may be implemented on a single semiconductor substrate 1010, but the present invention is not limited hereto, and the two sensor structures may be implemented in two separate semiconductor substrates, preferably arranged in a single virtual plane, at a same distance from an upper surface of the busbar. These substrates may be incorporated in a single packaged device (not shown), or may be incorporated in two separate devices. The processing circuit may be incorporated on the semiconductor substrate 1010, but that is not absolutely required.

In the example of FIG. 10, the U-shaped conductor portion 1020 has straight inner and outer corners, but that is not absolutely required, and the invention will also work if the U-shaped conductor portion has rounded inner or outer corners.

FIG. 11 is a high-level block-diagram of a magnetic sensor device 1120 proposed by the present invention. This Figure is provided for completeness only. It shows that the sensor device comprises one or more horizontal Hall elements H2, H1, H3, etc. each sensor element provides a signal h2, h1, h3 to a processing circuit 1122, e.g. to a controller, e.g. a programmable microcontroller.

While not explicitly shown, the sensor device 1120 may have other circuits, such as e.g. biasing and readout-circuitry, one or more amplifiers, one or more filters, one or more analog-to-digital convertors (ADC), etc. Such circuits are well known in the art and hence do not need to be explained in more detail here.

Depending on the implementation, the processing circuit, the one or more Hall elements, the biasing and readout circuit, etc. may be incorporated in a single semiconductor substrate, or in multiple semiconductor substrates. The sensor device 1120 may comprise a non-volatile memory 1121, (e.g. flash memory) which may store one or more predefined constants or parameters, e.g. parameters for determining a current value.

In embodiments of the present invention, the sensor circuit 1122 comprises one or more of the magnetic sensor structures illustrated above, for example, may include a magnetic sensor structure 505a as illustrated in FIG. 5A comprising an elongated IMC 513a and one horizontal Hall element H2 located under a centre of the IMC, and comprising a processing circuit configured to provide a signal equal to or proportional to the signal h2 obtained from the Hall element H2;

or may include a magnetic sensor structure 505b as illustrated in FIG. 5B comprising an elongated IMC 513b and one horizontal Hall element H2 located under a centre of the IMC, and another horizontal Hall element H6 located outside of the IMC, and comprising a processing circuit configured to provide a signal equal to or proportional to the signal (h2−h6), or a signal proportional to (h2−K*h6) where K is a predefined constant;

or may include a magnetic sensor structure 605 as illustrated in FIG. 6 comprising an elongated IMC 613 and one horizontal Hall element H2 located under a centre of the IMC, and another horizontal Hall element H4 located under the IMC, and comprising a processing circuit configured provide a signal equal to or proportional to the signal (h2−h4);

or may include a magnetic sensor structure 705 as illustrated in FIG. 7 comprising an elongated IMC 713 and one horizontal Hall element H2 located under a centre of the IMC, and two other horizontal Hall element H4, H5 located under the IMC, and comprising a processing circuit configured to provide a signal equal to or proportional to the signal 2*h2−(h4+h5);

or may include a magnetic sensor structure 805 as illustrated in FIG. 8A or FIG. 8B comprising an elongated IMC and one horizontal Hall element H2 located under a centre of the IMC, and two horizontal Hall elements H1, H3 located under the IMC, and comprising a processing circuit configured to provide a signal equal to or proportional to the signal s8=(h1+h3−h2), or a signal equal to or proportional to the signal s8'=(h2+h3−2*h2);

or may include two magnetic sensor structures as illustrated in FIG. 9A or FIG. 9B each comprising an elongated IMC and a horizontal Hall element H2*a*, H2*b* located under a centre of the respective IMC, wherein the two IMCs are oriented parallel to each other and are located on a same virtual line; and comprising a processing circuit configured to provide a signal equal to or proportional to the signal (h2a−h2b) obtained from the two Hall element H2*a*, H2*b*;

or may include two magnetic sensor structures as illustrated in FIG. 10 each comprising an elongated IMC and a horizontal Hall element H2*a*, H2*b* located under a centre of the respective IMC, wherein the two IMCs are oriented perpendicular to each other; and comprising a processing circuit configured to provide a signal equal to or proportional to the signal (h2a−h2b) obtained from the two Hall element H2*a*, H2*b*.

In certain embodiments, the gradient signal may be converted into a distance value, e.g. by using a predefined function or a lookup-table, and the sensor device 1120 is a distance sensor device.

In certain embodiments, a first gradient signal is a sine-like signal, and a second gradient signal is a cosine-like signal, and the sensor device is configured to determine a linear or an angular position based on the first and second gradient signal, and the sensor device 1120 is a position sensor device.

The present invention is also related to a method of determining a signal which is mainly dependent on one or more magnetic field gradients (e.g. dBx/dx), and which is substantially independent of an external disturbance field, comprising the steps of:

a) providing at least one semiconductor substrate comprising at least one horizontal Hall element (H2) embedded in a semiconductor substrate;

b) providing a magnetic flux concentrator (IMC) on the semiconductor substrate, the magnetic flux concentrator having an elongated portion extending in a first direction (X) parallel to the substrate and being arranged such that the horizontal Hall element (H2) is situated under a centre of the IMC.

Step a) may comprise: provide said semiconductor substrate as a CMOS substrate, further comprising a biasing and readout circuit, and a processing circuit;

Step a) may comprise: providing said semiconductor substrate comprising at least two or at least three horizontal Hall elements, e.g. at one or more locations that will not be located under the IMC (e.g. similar to H6 of FIG. 5B), or at one or more locations that will be located under the IMC (e.g. similar to H4 illustrated in FIG. 6, or similar to H4 and H5 illustrated in FIG. 7, or similar to H1 and H3 illustrated in FIG. 9A or FIG. 9B.

Step b) may further comprise: also providing a second IMC on the semiconductor substrate, e.g. oriented parallel to the first IMC (e.g. as in FIG. 9A or FIG. 9B) or oriented perpendicular to the first IMC (e.g. as in FIG. 10).

The method may further comprise one or more of the following steps:

c) arranging the at least one semiconductor substrate relative to an electrical conductor portion, e.g. in a manner as described above and/or as illustrated in any of FIG. 8A, FIG. 8B, FIG. 9A, FIG. 9B, FIG. 10;

d) determining a value indicative of the current flowing through said conductor portion, based on the signals obtained from the at least one horizontal Hall elements, e.g. as a linear combination thereof.

The invention claimed is:

1. A sensor device comprising:
at least one integrated magnetic sensor structure comprising:
a semiconductor substrate;
at least one magnetic flux concentrator IMC disposed on top of the semiconductor substrate, the at least one IMC having a predefined shape with an elongated portion extending in a first direction parallel to the semiconductor substrate;
at least one horizontal Hall element provided in or on the substrate, and situated under a centre of the at least one IMC;
a processing circuit connected to said at least one horizontal Hall element and configured to provide a signal or value indicative of at least one magnetic field gradient of a magnetic field ambient to the at least one integrated magnetic sensor structure,
wherein the sensor device is a current sensor device configured for measuring a magnetic field characteristic generated by a current flowing through an electrical conductor portion;
wherein the processing circuit is further configured to provide a signal or value indicative of said current, based on at least one signal obtained from the at least one horizontal Hall element.

2. The sensor device according to claim 1, wherein the predefined shape is an overall beam shape having a predefined length L and a predefined width W; or
wherein the elongated portion has an overall rectangular cross section in a plane parallel to the substrate, having a predefined length L and a predefined width W.

3. The sensor device according to claim 2, wherein a ratio L/W of the length L and the width W is at least 3.0; or
wherein a ratio L/W of the length L and the width W is a value in the range from 3.0 to 20.0; or
wherein a ratio L/W of the length L and the width W is a value in the range from 4.0 to 10.0; or
wherein a ratio L/W of the length L and the width W is a value in the range from 5.0 to 10.0.

4. The sensor device according to claim 1, wherein the at least one IMC comprises only a single IMC and the at least one horizontal hall element comprises only one horizontal Hall element situated under the centre of the single IMC; or
wherein the at least one IMC comprises a first and a second IMC, and wherein the at least one horizontal hall element comprises a first horizontal Hall element and a second horizontal Hall element, wherein the first horizontal Hall element is situated under a centre of the first IMC and the second horizontal Hall element is situated under a centre of the second IMC.

5. The sensor device according to claim 1, wherein the at least one IMC is a single IMC having an elongated shaped extending over a predefined length L; and
wherein the at least one horizontal Hall element comprises a first horizontal Hall element and a second horizontal Hall element wherein the first horizontal Hall element is situated under the centre of the single IMC, and the second horizontal Hall element is situated under the single IMC and is spaced from the centre of the single IMC by a distance in a range from L*26% to L*40%.

6. The sensor device according to claim 1, wherein the at least one IMC is a single IMC having an elongated shape extending over a predefined length L; and wherein the at least one horizontal Hall element comprises a first horizontal Hall element, a second horizontal Hall element and a third horizontal Hall element, each arranged under the single IMC, and arranged such that the first horizontal Hall element is situated in a middle between the second horizontal Hall element and the third horizontal Hall element.

7. The sensor device according to claim 6, wherein a distance between the centre of the single IMC and the second horizontal Hall element is at least L*41% and wherein a distance between the centre of the single IMC and the third horizontal Hall element is at least L*41%; or wherein a distance between the centre of the single IMC and the second horizontal Hall element is a distance in a range from L*26% to L*40% and wherein a distance between the centre of the single IMC and the third horizontal Hall element is a distance in a range from L*26% to L*40%.

8. The sensor device according to claim 1, wherein the at least one IMC comprises a single IMC, and wherein the at least one horizontal Hall element comprises three horizontal Hall elements situated under the single IMC, including a first horizontal Hall element, a second horizontal Hall element, and a third horizontal Hall element;

wherein the processing circuit is configured for determining a current in accordance with the formula: I=K*(h1+h3−h2), or in accordance with the formula I=K*(h1+h3−2*h2), where K is a predefined constant, h1 is a signal obtained from the first horizontal Hall element, and h3 is a signal obtained from the third horizontal Hall element, wherein the first horizontal Hall element and the third horizontal Hall element are located near ends of the single IMC, and h2 is a signal obtained from the second horizontal Hall element located near the centre of the single IMC.

9. The sensor device according to claim 1, wherein the at least one IMC comprises a first IMC and a second IMC, and the at least one horizontal Hall element comprises a first horizontal Hall element and a second horizontal Hall element, wherein the first horizontal Hall element is situated under the centre of the first IMC, and the second horizontal Hall element is situated under a centre of the second IMC;

wherein the processing circuit is configured for determining a current in accordance with the formula: I=K*(h2a−h2b), where K is a predefined constant, h2a is a signal obtained from the first horizontal Hall element, and h2b is a signal obtained from the second horizontal Hall element.

10. The sensor device according to claim 1, wherein the at least one IMC comprises a first IMC and a second IMC;

wherein the first IMC and the second IMC are oriented in parallel, and are located on a virtual line; or wherein the first IMC and the second IMC are oriented in parallel, and are spaced apart so as to define a virtual rectangle; or wherein the first IMC and the second IMC are oriented perpendicular to each other, and spaced apart from each other.

11. A current sensor system comprising:

the sensor device according to claim 1; and the electrical conductor portion, said electrical conductor portion extending in a predefined direction.

12. The current sensor system according to claim 11, wherein the at least one IMC comprises a single IMC, and wherein the at least one horizontal Hall element comprises three horizontal Hall elements arranged under the single IMC; and wherein the single IMC is oriented perpendicular to said predefined direction.

13. The current sensor system according to claim 11, wherein the at least one IMC comprises a first IMC and a second IMC, and the at least one horizontal Hall element comprises a first horizontal Hall element and a second horizontal Hall element, with the first horizontal Hall element arranged under the centre of the first IMC, and with the second horizontal Hall element arranged under a centre of the second IMC, and further arranged in one of the following ways:

i) wherein the first IMC and the second IMC are located on a virtual line, and the current sensor device is oriented such that the virtual line is oriented perpendicular to said predefined direction;

ii) wherein the first IMC and the second IMC are oriented in parallel to the predefined direction, and are spaced apart so as to define a virtual rectangle; and wherein the electrical conductor portion has a first and a second transverse cut-out; and wherein the first horizontal Hall element is situated above the first cutout, and the second horizontal Hall element is situated above the second cutout;

iii) wherein the electrical conductor portion has a U-shape comprising two legs interconnected by a bridge portion; and wherein the first IMC is oriented perpendicular to the bridge portion and the first horizontal Hall element is situated near an outer edge of the bridge portion; and wherein the second IMC is oriented parallel to the bridge portion and the second horizontal Hall element is situated between the two legs in the vicinity of an inner edge of the bridge portion.

* * * * *